United States Patent
Souriau et al.

(10) Patent No.: US 11,179,727 B2
(45) Date of Patent: Nov. 23, 2021

(54) METHOD FOR INTEGRATING STRUCTURES IN A SUPPORT AND ASSOCIATED DEVICE

(71) Applicant: COMMISSARIAT A L'ENERGIE ATOMIQUE ET AUX ENERGIES ALTERNATIVES, Paris (FR)

(72) Inventors: Jean-Charles Souriau, Grenoble (FR); Olivier Constantin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 251 days.

(21) Appl. No.: 16/514,490

(22) Filed: Jul. 17, 2019

(65) Prior Publication Data

US 2020/0023368 A1    Jan. 23, 2020

(30) Foreign Application Priority Data

Jul. 18, 2018 (FR) ..................... 18 56660

(51) Int. Cl.
*B01L 9/00* (2006.01)
*B29C 69/02* (2006.01)
(Continued)

(52) U.S. Cl.
CPC .............. *B01L 9/527* (2013.01); *B29C 69/02* (2013.01); *B01L 2200/0689* (2013.01);
(Continued)

(58) Field of Classification Search
CPC ..... B01L 2200/0689; B01L 2300/0848; B01L 2300/12; B01L 3/502707; B01L 9/527;
(Continued)

(56) References Cited

U.S. PATENT DOCUMENTS

2003/0064506 A1    4/2003    Vischer
2008/0032425 A1    2/2008    Hillis et al.
(Continued)

FOREIGN PATENT DOCUMENTS

FR    2 934 082 A1    1/2010
JP        8-8463       1/1996
(Continued)

OTHER PUBLICATIONS

French Preliminary Search Report dated Jun. 5, 2019 in French Application 18 56660, filed on Jul. 18, 2018 (with English Translation of Categories of Cited Documents).

*Primary Examiner* — Jennifer Wecker
*Assistant Examiner* — Jonathan Bortoli
(74) *Attorney, Agent, or Firm* — Oblon, McClelland, Maier & Neustadt, L.L.P.

(57) ABSTRACT

The invention relates to a method for integrating structures in a support, which comprises the steps:
  a) supplying a support comprising a front face and a rear face, and through cavities each delimited by a wall designated through wall;
  b) inserting into each of the through cavities a structure, provided with a first face and a second face connected by a contour, the first face and the front face being coplanar, the through cavities and/or the structures being laid out to leave a peripheral space;
  c) filling the peripheral space with a sealing material so as to maintain the structures to the support;
The peripheral space has a radial extension length which decreases from the rear face to the front face.

17 Claims, 4 Drawing Sheets

(51) Int. Cl.
*B29K 63/00* (2006.01)
*B29L 31/00* (2006.01)

(52) U.S. Cl.
CPC ... *B01L 2300/0848* (2013.01); *B01L 2300/12* (2013.01); *B29K 2063/00* (2013.01); *B29L 2031/756* (2013.01)

(58) Field of Classification Search
CPC .......... B29K 2063/00; B29L 2031/756; H01L 21/56; H01L 2224/96; H01L 23/3121
See application file for complete search history.

(56) References Cited

U.S. PATENT DOCUMENTS

| | | |
|---|---|---|
| 2010/0013060 A1 | 1/2010 | Lamy et al. |
| 2010/0047567 A1 | 2/2010 | Souriau |
| 2010/0195299 A1 | 8/2010 | Souriau et al. |

FOREIGN PATENT DOCUMENTS

| | | |
|---|---|---|
| JP | 2005-174979 | 6/2005 |
| WO | WO 2008/155231 A1 | 12/2008 |

METHOD FOR INTEGRATING STRUCTURES IN A SUPPORT AND ASSOCIATED DEVICE

TECHNICAL FIELD

The present invention relates to a method for integrating structures in through cavities of a support. In particular, the invention relates to the integration of chips intended to carry out chemical and/or biological analyses, in fluid lines.

PRIOR ART

A method for integrating structures in a support, known from the prior art, is described in documents [1] and [2] cited at the end of the description.

The integration method notably comprises the following steps:

a) supplying a support provided with two main faces designated, respectively, front face and rear face, the support comprising through cavities each delimited by a wall designated through wall;

b) inserting into each of the through cavities at least one structure, the at least one structure being provided with two faces, designated respectively first face and second face and connected by a contour, the insertion of the at least one structure being carried out such that the first face and the front face are coplanar, the through cavities and/or the structures being laid out to leave a peripheral through space around said structures, said peripheral space being delimited by the through wall and the contour;

c) filling the peripheral space with a sealing material so as to maintain the structures to the support.

At the end of step c), a cover may be arranged overlapping the first face of each of the structures. This cover may notably comprise fluid inlet and outlet channels, and form, with the first face, a fluid line. The fluid inlet and outlet channels are laid out to circulate one or more fluids intended for an analysis at the level of the first face of the structure.

In this respect, the structures may comprise, at the level of their first face, sensors, notably biological sensors for example intended for DNA sequencing, or instead chemical sensors.

Furthermore, in order to ensure a flow of fluid covering the whole of the first face, the cover generally has an extent greater than said first face. More specifically, the cover is also overlapping, at the level of the front face, the peripheral space.

This layout results in an exposure of the sealing material to the fluids likely to circulate in the fluid line.

This method known from the prior art is thus not satisfactory.

Indeed, this exposure of the sealing material may lead to interactions with said fluids, and thereby perturb their analysis.

Furthermore, a reduction in the radial extension length in order to reduce the interaction surface between the fluid and the sealing material cannot be envisaged. Indeed, the sealing material generally has a high viscosity, and a minimum radial extension length is required in order to enable the flow of said material into the peripheral space during step c).

One aim of the present invention is then to propose a device provided with structures integrated in a support as well as a method for integrating such structures making it possible to limit the interactions between the sealing material and the fluid to analyse.

Another aim of the present invention is to limit the topology of the surface formed by the sealing material between the surfaces, by limiting the shrinkage that occurs during hardening of the sealing material.

Another aim of the present invention is also to propose a method for integrating structures making it possible to conserve the coplanarity of the first face of the structures with the front face of the support.

DESCRIPTION OF THE INVENTION

The aims of the invention are, at least in part, attained by a method for integrating structures in a support, the method comprising the following steps:

a) supplying a support provided with two main faces designated, respectively, front face and rear face, the support comprising through cavities each delimited by a wall designated through wall;

b) inserting into each of the through cavities at least one structure, the at least one structure being provided with two faces, designated respectively, first face and second face connected by a contour, the insertion of the at least one structure being carried out such that the first face and the front face are coplanar, the through cavities and/or the structures being laid out to leave, around each of the structures, a peripheral through space delimited by the through wall and the contour;

c) filling the peripheral space with a sealing material so as to maintain the structures to the support;

the method being remarkable in that the peripheral space has a radial extension length which decreases from the rear face to the front face.

According to an embodiment, the sealing material comprises a first sealing material and a second sealing material, step c) comprises the filling by the first sealing material of a section, designated first section, of the peripheral space, then by the second sealing material different from the first sealing material, of another section, designated second section, of the peripheral space.

According to an embodiment, the first section is a section of the peripheral space for which the radial extension length is less than a predetermined length, and the second section is a section of the peripheral space for which the radial extension length is greater than a predetermined length.

According to an embodiment, for each of the peripheral spaces, a layer comprising the first sealing material is also formed on the through wall and the contour at the level of the second section.

According to an embodiment, the first sealing material comprises at least one of the materials selected from: epoxy adhesive filled or not with silica grains, polyurethane, elastomer, silicone, acrylic, methacrylate, polypropylene, parylene, a siloxane, glass or metal.

According to an embodiment, the second sealing material comprises at least one of the materials selected from: epoxy adhesive filled with silica grains, polyurethane, elastomer, silicone, acrylic, methacrylate, polypropylene or fusible glass.

According to an embodiment, the radial extension length varies in a continuous manner from the rear face to the front face, advantageously for each of the peripheral spaces, the through wall has a convergent inclination from the rear face to the front face and/or the contour has a divergent inclination from the rear face to the front face.

According to an embodiment, the radial extension length at the level of the first section is less than 50% of the radial extension length at the level of the rear face.

According to an embodiment, the first section has a constant radial extension length, designated first length, the first length being advantageously less than 25%, preferentially less than 10%, the radial extension length at the level of the rear face.

According to an embodiment, the second section has a constant radial extension length, designated second length.

According to an embodiment, for each of the through cavities, the through wall has a shoulder.

According to an embodiment, the contour of each of the structures has a shoulder.

According to an embodiment, the second section extends, from the rear face, over a depth corresponding to at least half of the thickness of the support.

According to an embodiment, the radial extension length at the level of the front face is comprised between 5 µm and 100 µm.

According to an embodiment, the structure comprises, on its first face, at least one reaction site or a sensor, the reaction site and the sensor being advantageously intended for biological or chemical applications.

According to an embodiment, the structure comprises, on its first face, an actuator, the actuator being advantageously intended to emit a radiation of a predetermined wavelength.

According to an embodiment, the first material is selected so as not to absorb the chemical or biological species intended to interact with the reaction site or the sensor.

According to an embodiment, the first material selected has a level of fluorescence at the predetermined wavelength below a given value.

According to an embodiment, the second sealing material has a Young's modulus comprised in an interval of +/−20%, advantageously +/−15%, of the Young's modulus of the support.

According to an embodiment, each structure comprises a first structure and a second structure each having a face coplanar with the front face.

According to an embodiment, step b) is preceded by a step of assembly a1) of the front face of the support with a temporary face of a temporary substrate.

According to an embodiment, step a1) is carried out by means of an adhesion layer formed on the temporary face of the temporary substrate, the adhesion layer comprises in particular at least one of the materials selected from: a resin, a laminated adhesive film, a photosensitive polymer.

According to an embodiment, step c) is followed by a step d) of dismantling the temporary substrate corresponding to the removal of the latter.

According to an embodiment, the through cavities are formed by dry etching or by wet etching.

The invention also relates to a device capable of being obtained by the method according to the present invention, the device comprising:

a) a support provided with two main faces designated, respectively, front face and rear face, the support comprising a through cavity delimited by a wall designated through wall;

b) at least one structure, the at least one structure being provided with two faces, designated respectively, first face and second face connected by a contour, the at least one structure being housed in the through cavity and such that the first face and the front face are coplanar, the through cavity and/or the at least one structure being laid out to leave, around the structure, a peripheral through space delimited by the through wall and the contour;

the peripheral space being filled with a sealing material so as to maintain the structures to the support;

the device being remarkable in that the peripheral space has a radial extension length which decreases from the rear face to the front face.

According to an embodiment, the sealing material comprises a first sealing material and a second sealing material, the first sealing material filling a section, designated first section, of the peripheral space, and the second sealing material different from the first sealing material, filling another section, designated second section, of the peripheral space.

According to an embodiment, the first section is a section of the peripheral space for which the radial extension length is less than a predetermined length, and the second section is a section of the peripheral space for which the radial extension length is greater than a predetermined length.

According to an embodiment, a layer comprising the first sealing material is also formed on the through wall and the contour at the level of the second section.

According to an embodiment, the first sealing material comprises at least one of the materials selected from: epoxy adhesive filled or not with silica grains, polyurethane, elastomer, silicone, acrylic, methacrylate, polypropylene, parylene, siloxane, glass or metal.

According to an embodiment, the second sealing material comprises at least one of the materials selected from: epoxy adhesive filled with silica grains, polyurethane, elastomer, silicone, acrylic, methacrylate, polypropylene or fusible glass.

According to an embodiment, the radial extension length varies in a continuous manner from the rear face to the front face, advantageously the through wall has a convergent inclination from the rear face to the front face and/or the contour has a divergent inclination from the rear face to the front face.

According to an embodiment, the radial extension length at the level of the first section is less than 50% of the radial extension length at the level of the rear face.

According to an embodiment, the first section has a constant radial extension length, designated first length, the first length being advantageously less than 25%, preferentially less than 10%, the radial extension length at the level of the rear face.

According to an embodiment, the second section has a constant radial extension length, designated second length.

According to an embodiment, the through wall has a shoulder.

According to an embodiment, the contour has a shoulder.

According to an embodiment, the second section extends, from the rear face, over a depth corresponding to at least half of the thickness of the support.

According to an embodiment, the radial extension length at the level of the front face is comprised between 5 µm and 100 µm.

According to an embodiment, the second sealing material has a Young's modulus comprised in an interval of +/−20%, advantageously +/−15%, of the Young's modulus of the support.

According to an embodiment, the structure comprises a first structure and a second structure each having a face coplanar with the front face of the support.

BRIEF DESCRIPTION OF THE DRAWINGS

Other characteristics and advantages will become clear from the description that follows of the method for integrating structures according to the invention, given as non-limiting examples, with reference to the appended drawings, in which:

FIGS. 1a to 1f are schematic representations of the different steps of the method for integrating structures according to the present invention;

FIGS. 3a and 3b are schematic representations along a sectional plane along a direction orthogonal to its main faces of a second exemplary embodiment of the present invention, FIGS. 3a and 3b represent notably a structure inserted into a through cavity.

DETAILED DESCRIPTION OF PARTICULAR EMBODIMENTS

The present invention relates to a method for integrating structures in a support, and notably for sealing, with a sealing material, said structures in through cavities formed in the support.

The sealing of structures involves in particular a shaping of a sealing space, designated peripheral space, arranged between the contour of the structures and the wall delimiting the through cavities. Notably, the peripheral space according to the invention has a radial extension length which decreases from the rear face to the front face of the support so as to limit the exposure of the sealing material at the level of the front face of the support.

Thus, in FIGS. 1a-1f, 2, 3a and 3b may be seen exemplary embodiments of the method for integrating structures in a support.

Figure 1A:
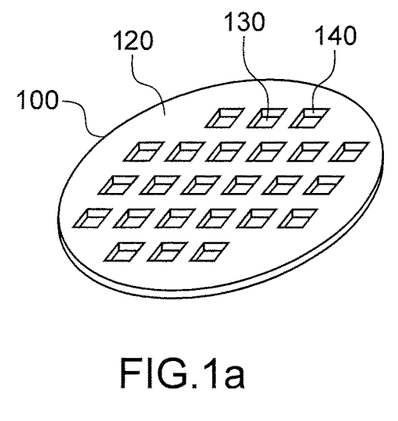
Figure 1B:
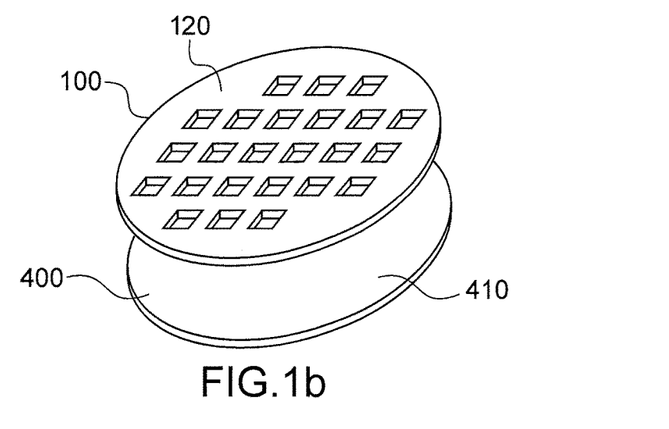
Figure 1C:
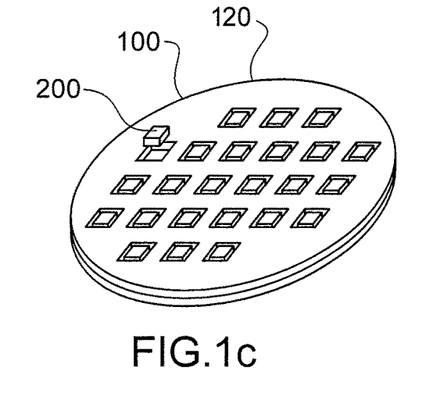
Figure 1D:
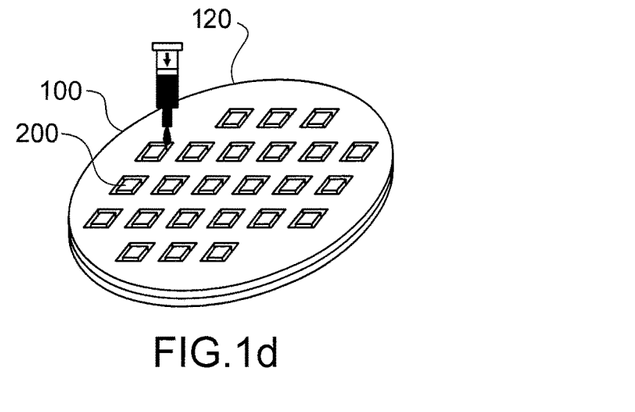

In particular the method according to the present invention comprises the following steps:

a) supplying a support 100 provided with two main faces designated, respectively, front face 110 and rear face 120. The support 100 notably comprises through cavities 130 each delimited by a wall designated through wall 140 (FIG. 1a).

b) inserting into each of the through cavities 140 at least one structure 200. The at least one structure 200 is, in this respect, provided with two faces, designated respectively first face 210 and second face 220, connected by a contour 230. The insertion of the at least one structure 200 is carried out such that the first face 210 and the front face 110 are coplanar. Furthermore, the through cavities 130 and/or the structures 200 are laid out to leave, around each of the structures, a peripheral through space 300 delimited by the through wall 140 and the contour 230 (FIGS. 1c, 2, 3a and 3b).

c) filling the peripheral space 300 with a sealing material so as to maintain the structures 200 to the support 100 (FIG. 1d).

Figure 2:
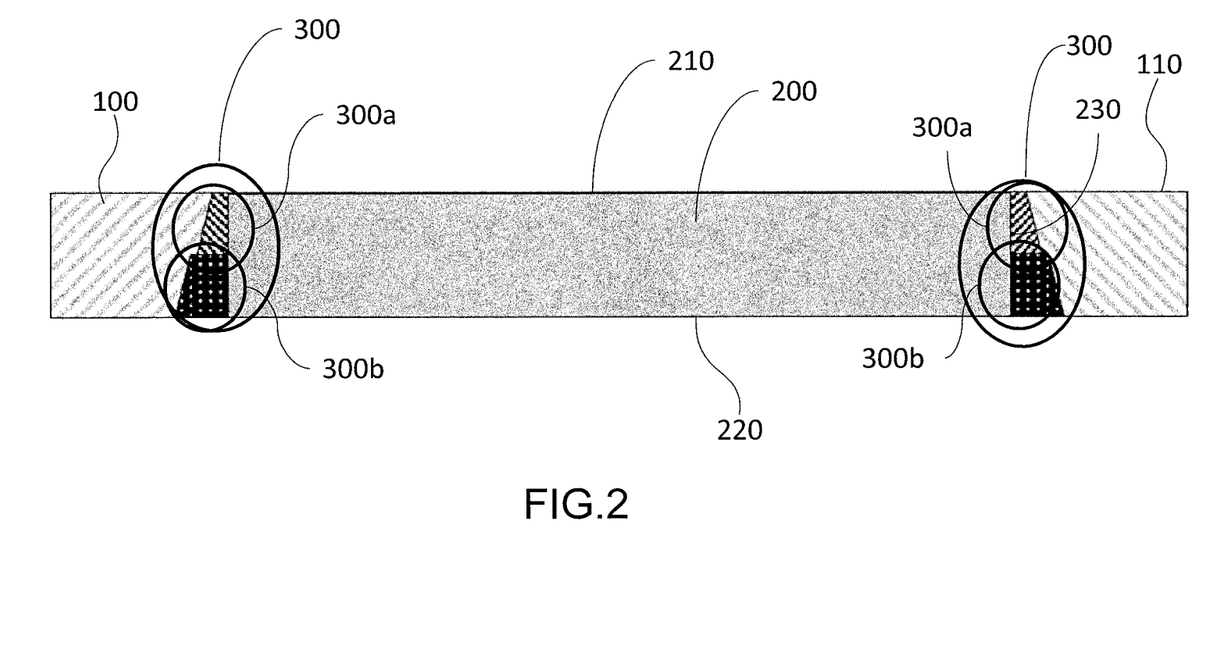
FIG. 2 is a schematic representation along a sectional plane of the support along a direction orthogonal to its main faces of a first exemplary embodiment of the present invention, FIG. 2 notably represents a structure inserted into a through cavity.
Figure 3A:
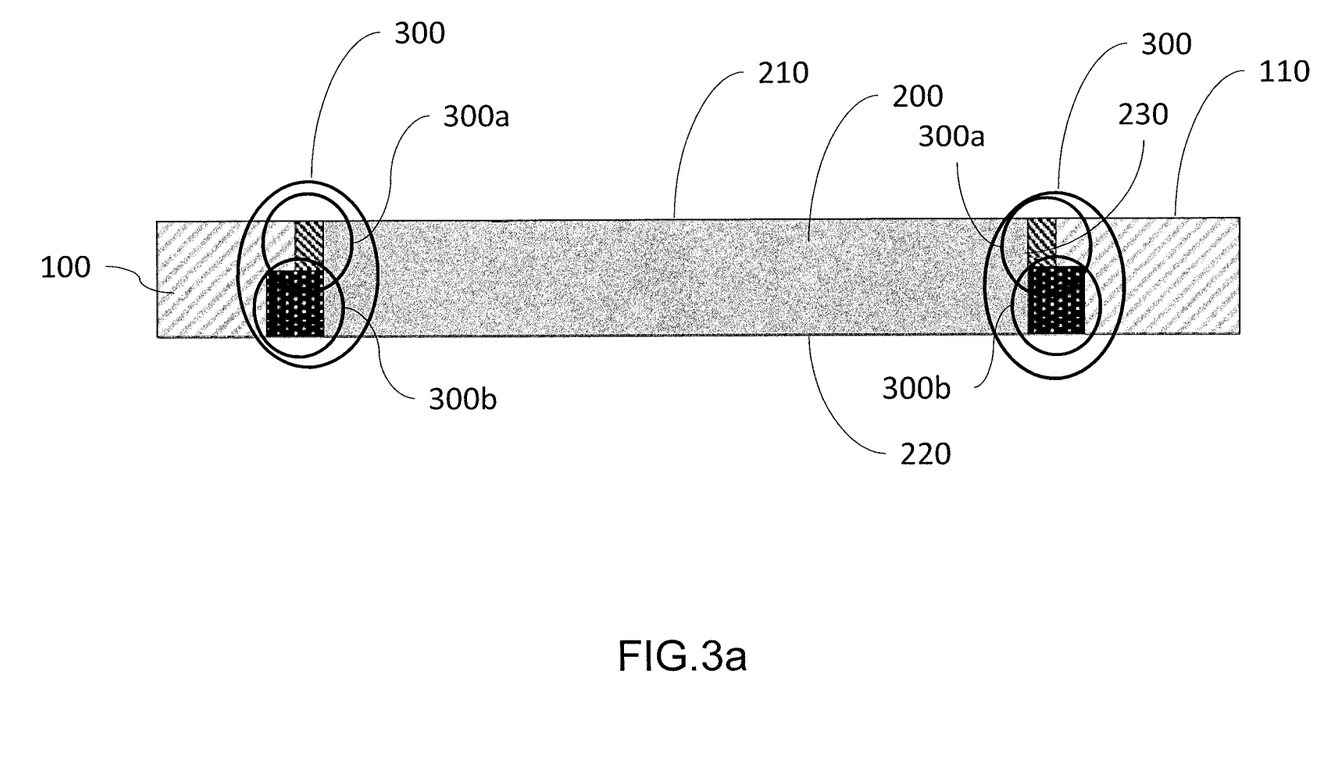
Figure 3B:
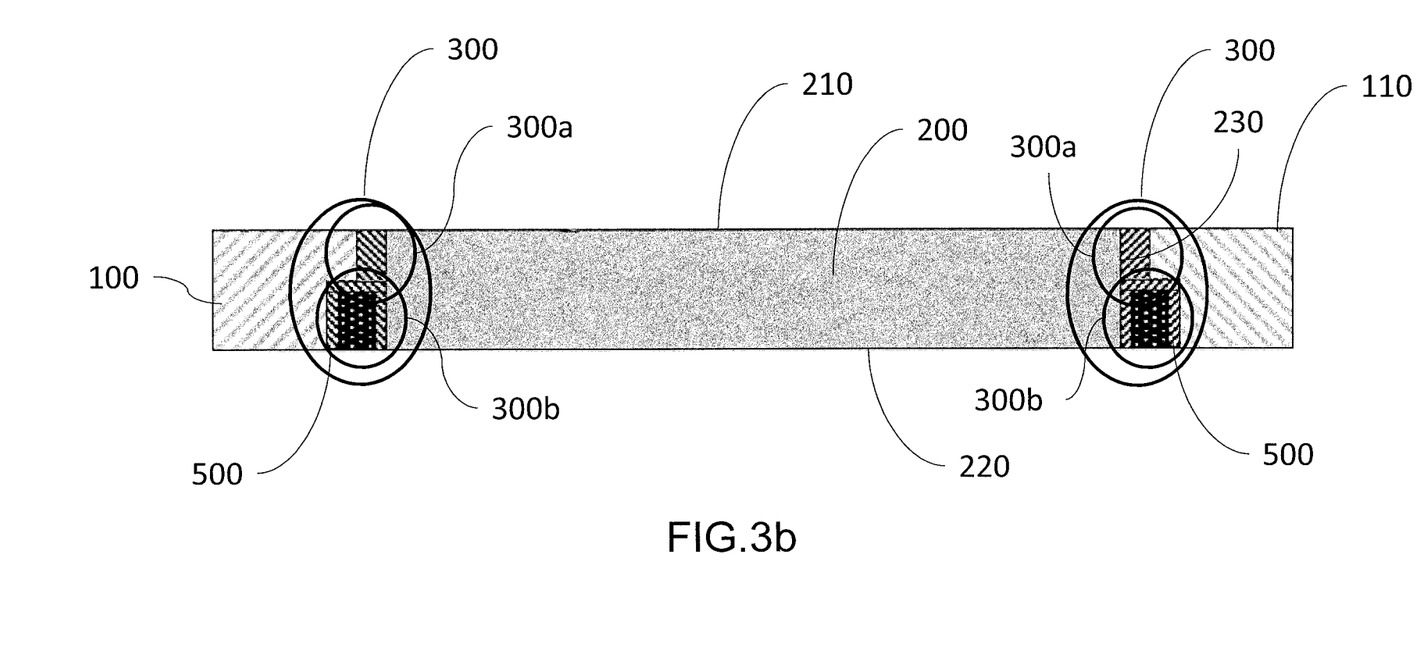

According to the present invention, the peripheral space 300 has a radial extension length which decreases from the rear face 120 to the front face 110 (FIGS. 2, 3a and 3b).

In other words, a shrinkage of the peripheral space 300 is observed from the rear face 120 to the front face 110 (FIGS. 2, 3a and 3b).

"Radial extension length" is taken to mean the distance between the through wall 140 and the contour 230 delimiting the peripheral space.

Furthermore, it is understood that, for each through cavity 130, the peripheral space 300 circumvents the structure, housed in the designated cavity, in its entirety.

The support 100 supplied at step a) may comprise any type of material, and notably comprise at least one of the materials selected from: silicon, glass, polymer or plastic, aluminium nitride or a ceramic.

The support 100 may also comprise a PCB (Printed Circuit Board).

The support 100 may also comprise a passivation layer. For example, the passivation layer of a silicon support may comprise silicon oxide, deposited or obtained by thermal oxidation, or instead silicon nitride.

"Through cavity" is taken to mean a cavity emerging on one and the other of the front 110 and rear 120 faces of the support 100.

The through cavities 130 may be formed by micromanufacturing techniques known to those skilled in the art, and may more specifically involve steps of photolithography, hard mask formation, and wet or dry etching.

The through cavities 130 may, in an alternative manner, be formed by sanding, laser machining or mechanical techniques. These subtractive techniques are advantageously implemented in silicon, glass or a polymer.

In an alternative manner, the support 100 provided with the through cavity 130 may be manufactured by additive manufacturing (3D printing, injection), for example when a polymer is considered.

The support 100 may also have a thickness comprised between 200 µm and 1000 µm, advantageously between 300 µm and 800 µm, in particular equal to 725 µm.

Step b) comprises the insertion of structures 200 into the through cavities 130.

The insertion of the structures 200 into said cavities is notably adapted so that at the end of step b), the first face 210 of the structures 200 is coplanar with the front face 110.

The alignment of the structures 200 in the through cavities may notably involve alignment patterns formed on the rear face 120 or on a temporary face 410 of a temporary substrate 400 which will be described in the remainder of the description.

This layout is particularly advantageous, notably within the scope of fluidic or microfluidic applications, since it makes it possible to limit the perturbations of a fluidic flow at the level of the first face 210. It may also make it possible to limit the interaction of the sealing material with the fluids or species of interest conveyed by the fluids (for example adsorption of proteins). This layout may also limit or eliminate the topology which can arise during hardening of the sealing material.

Step b) may be preceded by a step of assembly of the front face 110 of the support 100 with a face, designated temporary face 410, of a temporary substrate 400 (FIG. 1b).

It is understood that this assembly is temporary, and that the adhesion between the temporary face 410, the front face 110 and the first face 210, as well as the surface in contact with the sealing material, is detachable.

In this respect, the assembly may be obtained by molecular adhesion, or through an adhesion layer formed on the temporary face 410.

The adhesion layer may notably comprise a resin, a laminated adhesive film, a photosensitive polymer.

The temporary substrate 400 may comprise at least one of the materials selected from: silicon, glass, quartz, alumina, plastic.

In an alternative manner, the temporary substrate 400, within the meaning of the present invention, may be an adhesive film.

The implementation of the temporary substrate 400 makes it possible, during the insertion of the structures 200 into the through cavities 130, to ensure the coplanarity of the first faces 210 with the front face 110.

However, the invention must not be limited to the implementation of a step of assembly with the temporary substrate.

Step b) is then followed by step c) of sealing the structures 200 to the support 100. Step c) notably comprises the filling of the peripheral space 300 by the sealing material so as to maintain the structures 200 to the support 100.

The filling may advantageously comprise a step of injection of the sealing material.

The filling may be carried out in one or several steps.

For example, the sealing material may comprise a first sealing material and a second sealing material.

In particular, the first sealing material may fill the narrowest section, hereafter called first section 300a, of the peripheral space 300.

In an equivalent manner, the second sealing material may fill the widest section, hereafter called second section 300b, of the peripheral space 300.

In a particularly advantageous manner, the first sealing material has a viscosity less than the viscosity of the second sealing material.

The filling of the peripheral space by the sealing material may only be partial. For example, only the first section 300a may be filled by the filling material. Still as an example, the filling of the peripheral space 300 by the filling material may be below 50%, or instead below 30%.

The first section 300a is a section of the peripheral space for which the radial extension length is less than a predetermined length, and the second section is a section of the peripheral space 300 for which the radial extension length is greater than said predetermined length.

The predetermined length is dependent on the nature of the second sealing material, and notably its viscosity. More specifically, the higher the viscosity of the second sealing material the greater the space required for the flow of the second material, and consequently the greater the predetermined length.

For example, the second section may extend, from the rear face 120, over a depth corresponding to at least half of the thickness of the support 100.

The radial extension length at the level of the front face 110 may be comprised between 5 μm and 100 μm.

The filling of the first section by the first sealing material may be carried out using a syringe, by material jet, by vacuum lamination or by chemical vapour deposition of parylene.

The filling of the second section by the first or the second sealing material may be carried out using a syringe, by material jet, by vacuum lamination, by injection or by moulding.

During the carrying out of step c), for each of the peripheral spaces, a layer 500 comprising the first sealing material may also be formed on the through wall 140 and the contour 230 at the level of the second section 300b (FIG. 3c). The layer may notably have a thickness less than 10 μm.

In an advantageous manner, the first sealing material comprises at least one of the materials selected from: epoxy adhesive filled or not with silica grains, polyurethane, parylene, a siloxane, elastomer, silicone, acrylic, methacrylate, polypropylene, glass or metal. These materials may be judiciously selected for their low chemical reactivity or their low fluorescence.

Still in an advantageous manner, the second sealing material may comprise at least one of the families of materials selected from: epoxy adhesive filled with silica grains, polyurethane, elastomer, silicone, acrylic, methacrylate, polypropylene and fusible glass.

The second sealing material may have a Young's modulus comprised in an interval of +/−20%, advantageously +/−15%, around the Young's modulus of the support 100.

The second sealing material may have a coefficient of thermal expansion (CTE) comprised in an interval of +/−20%, advantageously +/−15%, around the CTE of the support 100.

The step of filling the peripheral space by the sealing material may advantageously be followed by a step, designated hardening step, intended to dry said material. The hardening step may for example involve a heat treatment.

Figure 1E:
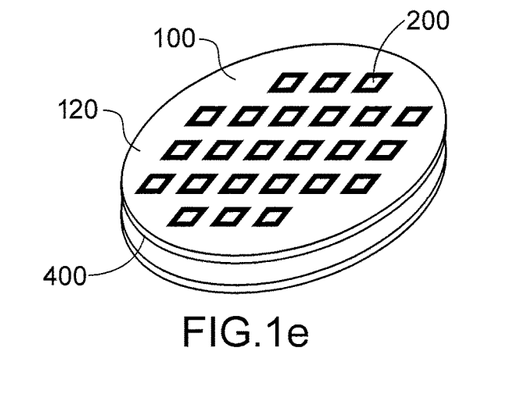

If the implementation of the temporary substrate 400 is considered, step c) is then followed by a step of dismantling said substrate 400 (FIGS. 1e and 1f).

The dismantling of the temporary substrate 400 will depend on the type of assembly between the front face 110 and the temporary face 410.

In particular, the dismantling may involve a mechanical or thermal stress, a peeling, a chemical etching or instead a step of insolation of the adhesion layer.

The configuration of the peripheral space 300, and notably its shrinkage, makes it possible to limit the exposure of the sealing material at the level of the front face, notably the exposure to fluids in the field of fluidic applications.

Furthermore, the greater opening of the peripheral space 300 at the level of the rear face 120 makes it possible to consider a sealing material having a high viscosity.

According to a first exemplary embodiment illustrated in FIG. 2, the radial extension length can vary in a continuous manner, and notably linearly, from the rear face 120 to the front face 110.

Notably, according to this first example, the through wall 140 may have a convergent inclination from the rear face to the front face and/or the contour may have a divergent inclination from the rear face to the front face.

"Convergent inclination from the rear face to the front face" is taken to mean for example a truncated cone or pyramid.

"Divergent inclination from the rear face to the front face" is taken to mean an inverted truncated cone or pyramid.

A through wall 140 having a convergent inclination may for example be obtained by forming the through cavities by liquid chemical etching, for example with a solution of TMAH or KOH.

In particular, according to this first example, the radial extension length at the level of the first section 300a is less than 50% of the radial extension length at the level of the rear face 120.

According to a second exemplary embodiment, the first section 300a has a constant radial extension length, designated first length (FIGS. 3a and 3b).

In particular, the first length may advantageously be less than 25%, preferentially less than 10%, the radial extension length at the level of the rear face 120.

In a complementary manner, the second section 300b has a constant radial extension length, designated second length, greater than the first length.

This configuration may for example be reflected by the presence of a shoulder at the level of the through wall 140.

In a complementary or alternative manner, the contour of each of the structures has a shoulder.

The invention is not however limited to these two embodiments. Notably only one section among the first section 300a and the second section 300b may have a constant radial extension length, whereas the other section has a variable extension length.

Still within the scope of the present invention, one and/or the other of the contour 230 and the through wall 140 may have a plurality of shoulders.

The structure 200 may comprise, on its first face 210, a sensor.

The sensor may be for example a sensor intended to carry out chemical analyses of a fluid circulating at the level of the first face 210.

In an alternative manner, the sensor may be a biological sensor, for example applied to gene sequencing.

In an advantageous manner, the first material may be selected so as not to adsorb the chemical or biological species intended to interact with the sensor.

In an alternative or complementary manner, the structure 200 may comprise, on its first face, at least one reaction site, for example a reaction site intended to carry out biological or chemical analyses of a fluid circulating at the level of the first face 210.

In an advantageous manner, the first material may be selected so as not to absorb the chemical or biological species intended to interact with the reaction site.

Still in an alternative or complementary manner, the structure 200 may comprise, on its first face 210, an actuator, and notably an actuator intended to emit a radiation of a predetermined wavelength. The predetermined wavelength is for example a wavelength comprised between 400 nm and 780 nm.

The first material selected may then have a level of fluorescence at the predetermined wavelength below a given value.

Whatever the considered embodiment, the first material selected is inert vis-à-vis the targeted application.

"Inert" is taken to mean a first material that will interact in a limited manner with a fluid circulating at the level of the first face of the sensor or with species of interest circulating in said fluid.

For applications in the biology field, and notably DNA sequencing, a first non-fluorescent material will be particularly advantageous.

Still as an example, for applications in the chemistry field, the first material will be selected so as not to react chemically with the fluids intended to be analysed by the sensor.

In a complementary manner, each structure may comprise a first structure and a second structure each having a face coplanar with the front face. For example, the first structure may comprise a CMOS imager and the second structure a luminous excitation source of the VCSEL type.

At the end of the method according to the present invention, a cover may be arranged overlapping the first face of each of the structures. This cover may notably comprise fluid inlet and outlet channels, and form, with the first face, a fluid line. The fluid inlet and outlet channels are laid out to circulate one or more fluids intended to be analysed at the level of the first face of the structure.

The present invention is advantageously implemented for microfluidic applications intended for the chemical, biochemical or biological analysis of fluids.

REFERENCES CITED

[1] WO 2008/155231
[2] FR 2934082

The invention claimed is:

1. Method for integrating structures in a support, the method comprising the following steps:
   a) supplying a support provided with two main faces designated, respectively, front face and rear face, the support comprising through cavities each delimited by a wall designated through wall;
   b) inserting into each of the through cavities at least one structure, the at least one structure being provided with two faces, designated respectively, first face and second face connected by a contour, the insertion of the at least one structure being carried out such that the first face and the front face are coplanar, the through cavities and/or the structures being laid out to leave, around each of the structures, a peripheral through space delimited by the through wall and the contour;
   c) filling the peripheral space with a sealing material so as to maintain the structures to the support;
   the method further wherein the peripheral space has a radial extension length which decreases from the rear face to the front face and in that the sealing material comprises a first sealing material and a second sealing material different from the first sealing material, step c) comprises the filling by the first sealing material of a section, designated first section, of the peripheral space, then by the second sealing material of another section, designated second section, of the peripheral space.

2. Method according to claim 1, wherein, for each of the peripheral spaces, a layer comprising the first sealing material is also formed on the through wall and the contour at the level of the second section.

3. Method according to claim 1, wherein the first sealing material comprises at least one of the materials selected from: epoxy adhesive filled or not with silica grains, polyurethane, parylene, a siloxane, elastomer, silicone, acrylic, methacrylate, polypropylene, glass or metal.

4. Method according to claim 1, wherein the second sealing material comprises at least one of the materials selected from: epoxy adhesive filled with silica grains, polyurethane, elastomer, silicone, acrylic, methacrylate, polypropylene and fusible glass.

5. Method according to claim 1, wherein the radial extension length varies in a continuous manner from the rear face to the front face.

6. Method according to claim 1, wherein the radial extension length at the level of the first section is less than 50% of the radial extension length at the level of the rear face.

7. Method according to claim 1, wherein the first section has a constant radial extension length, designated first length.

8. Method according to claim 1, wherein the second section extends, from the rear face, over a depth corresponding to at least half of the thickness of the support.

9. Method according to claim 1, wherein the radial extension length at the level of the front face is comprised between 5 μm and 100 μm.

10. Method according to claim 1, wherein the second sealing material has a Young's modulus comprised in an interval of +/−20% of the Young's modulus of the support.

11. Method according to claim 1, wherein each structure comprises a first structure and a second structure each having a face coplanar with the front face.

12. Method according to claim 1, wherein step b) is preceded by a step of assembly a1) of the front face of the support with a temporary face of a temporary substrate.

13. Device comprising:
a) a support provided with two main faces designated, respectively, front face and rear face, the support comprising a through cavity delimited by a wall designated through wall;
b) at least one structure, the at least one structure being provided with two faces, designated respectively first face and second face, connected by a contour, the at least one structure being housed in the through cavity and such that the first face and the front face are coplanar, the through cavity and/or the at least one structure being laid out to leave, around the structure, a peripheral through space delimited by the through wall and the contour;
the peripheral space being filled with a sealing material so as to maintain the structures to the support;
the device further wherein the peripheral space has a radial extension length which decreases from the rear face to the front face, and in that the sealing material comprises a first sealing material and a second sealing material different from the first material, the first sealing material filling a section, designated first section, of the peripheral space, and the second sealing material filling another section, designated second section, of the peripheral space.

14. Device according to claim 13, wherein a layer comprising the first sealing material is also formed on the through wall and the contour at the level of the second section.

15. Device according to claim 13, wherein the radial extension length varies in a continuous manner from the rear face to the front face.

16. Device according to claim 13, wherein the first section has a constant radial extension length, designated first length.

17. Device according to claim 16, wherein the second section has a constant radial extension length, designated second length.

* * * * *